United States Patent
Chisaka

(10) Patent No.: US 12,074,589 B2
(45) Date of Patent: Aug. 27, 2024

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventor: Junichi Chisaka, Kawasaki Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

(*) Notice: Subject to any disclaimer, the term of this patent is extended or adjusted under 35 U.S.C. 154(b) by 50 days.

(21) Appl. No.: 17/939,790

(22) Filed: Sep. 7, 2022

(65) Prior Publication Data

US 2023/0291396 A1    Sep. 14, 2023

(30) Foreign Application Priority Data

Mar. 14, 2022  (JP) ................. 2022-039224

(51) Int. Cl.
*H03K 17/06* (2006.01)
*H03K 17/081* (2006.01)

(52) U.S. Cl.
CPC ..... *H03K 17/063* (2013.01); *H03K 17/08104* (2013.01)

(58) Field of Classification Search
None
See application file for complete search history.

(56) References Cited

U.S. PATENT DOCUMENTS

| | | | |
|---|---|---|---|
| 6,087,877 A | 7/2000 | Gonda et al. | |
| 8,351,172 B2 * | 1/2013 | Nakahara | H02J 7/00308 361/84 |
| 8,638,534 B2 | 1/2014 | Nakahara | |
| 10,720,922 B1 | 7/2020 | Chisaka | |
| 2020/0295749 A1* | 9/2020 | Akahane | H03K 3/356 |

FOREIGN PATENT DOCUMENTS

| | | |
|---|---|---|
| JP | 2004-032893 A | 1/2004 |
| JP | 3814958 B2 | 8/2006 |
| JP | 2012-222724 A | 11/2012 |
| JP | 5438468 B2 | 3/2014 |
| JP | 2014-165575 A | 9/2014 |
| JP | 2020-123781 A | 8/2020 |

* cited by examiner

*Primary Examiner* — Kenneth B Wells
(74) *Attorney, Agent, or Firm* — Maier & Maier, PLLC

(57) ABSTRACT

According to one embodiment, a semiconductor device includes a first transistor, a first circuit, a second circuit, and a third circuit. The first transistor has one end connected to a power supply voltage terminal, the other end connected to a first node, and a gate connected to a first output terminal. The first circuit is configured to control a voltage of the first node based on a voltage of a ground voltage terminal. The second circuit is configured to control a voltage of the first output terminal based on the voltage of the ground voltage terminal and a voltage of an input terminal. The third circuit is configured to control switching between connection and disconnection between the ground voltage terminal and the first circuit.

9 Claims, 7 Drawing Sheets

SEMICONDUCTOR DEVICE

CROSS-REFERENCE TO RELATED APPLICATIONS

This application is based upon and claims the benefit of priority from Japanese Patent Application No. 2022-039224, filed Mar. 14, 2022, the entire contents of which are incorporated herein by reference.

FIELD

Embodiments described herein relate generally to a semiconductor device.

BACKGROUND

A semiconductor device for supplying a power supply voltage to an external load is known.

DETAILED DESCRIPTION

Figure 1:
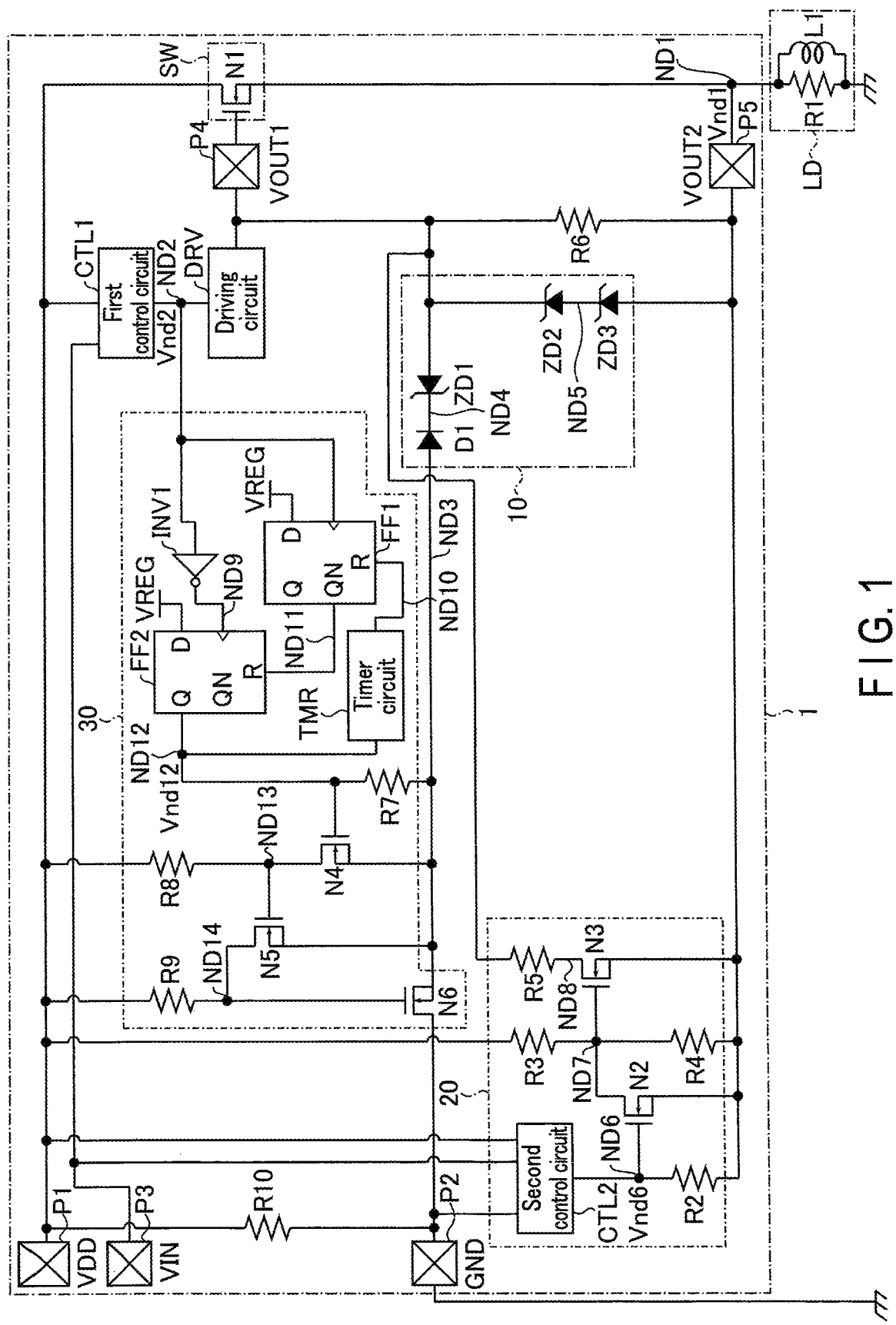
FIG. 1 is a circuit diagram showing an example of a semiconductor device according to a first embodiment.

In general, according to one embodiment, a semiconductor device includes a first transistor, a first circuit, a second circuit, and a third circuit. One end of the first transistor is connected to a power supply voltage terminal, the other end of the first transistor is connected to a first node, and a gate of the first transistor is connected to a first output terminal. The first circuit is configured to control a voltage of the first node based on a voltage of a ground voltage terminal. The second circuit is configured to control a voltage of the first output terminal based on the voltage of the ground voltage terminal and a voltage of an input terminal. The third circuit is configured to control switching between connection and disconnection between the ground voltage terminal and the first circuit.

Hereinafter, embodiments will be described with reference to the accompanying drawings. In the following description, constituent elements having substantially the same function and configuration will be assigned the same reference numeral or symbol and repetitive descriptions may be omitted. All the descriptions of an embodiment are applicable as descriptions of another embodiment, unless explicitly or self-evidently excluded.

1. First Embodiment

A semiconductor device according to a first embodiment will be described. Hereinafter, a semiconductor device configured to supply a power supply voltage to an external load by driving a switching element will be described as an example.

1.1 Configuration

1.1.1 Circuit Configuration of Semiconductor Device

A circuit configuration of the semiconductor device according to the present embodiment will be described with reference to FIG. 1. FIG. 1 is a circuit diagram showing an example of a semiconductor device. Hereinafter, when a source and a drain of a transistor are not distinguished from each other, one of them will be referred to as "one end of a transistor" and the other of them will be referred to as "the other end of the transistor".

A semiconductor device 1 is, for example, an integrated circuit (IC) chip. The semiconductor device 1 supplies a power supply voltage to an external load LD. The semiconductor device 1 and the load LD may correspond to, for example, a part of a vehicle-mounted system. The load LD may correspond to, for example, a headlight, a power window, etc.

The semiconductor device 1 includes a power supply voltage terminal P1, a ground voltage terminal P2, an input terminal P3, a first output terminal P4, a second output terminal P5, a switching element SW, a first control circuit CTL1, a driving circuit DRV, a clamp circuit 10, a disconnection protection circuit 20, a switching control circuit 30, and resistance elements R6 and R10.

A power supply voltage VDD is supplied from an outside to the power supply voltage terminal P1.

A ground voltage GND is supplied from the outside to the ground voltage terminal P2. For example, the ground voltage terminal P2 is electrically connected to a power supply (hereinafter, also referred to as "GND power supply") that supplies the voltage GND via an interconnect. In the case of the vehicle-mounted system, for example, a connector for the voltage GND of a vehicle battery is electrically connected to the ground voltage terminal P2. The ground voltage terminal P2 may be grounded.

A voltage VIN is supplied from the outside to the input terminal P3. The voltage VIN is a voltage at a High ("H") level or at a Low ("L") level. A voltage at the "L" level is, for example, the voltage GND. The semiconductor device 1 operates based on the voltage VIN.

A voltage VOUT1 is applied from the first output terminal P4 to the switching element SW.

A voltage VOUT2 is applied from the second output terminal P5 to a node ND1.

The switching element SW is, for example, an n-channel Metal Oxide Semiconductor Field Effect Transistor (MOSFET). The switching element SW switches between connection and disconnection between the power supply voltage terminal P1 and the external load LD. The following will describe a case in which the switching element SW is an n-channel MOSFET (hereinafter, also referred to as an "NMOS transistor") N1.

The transistor N1 has one end connected to the power supply voltage terminal P1, the other end connected to the node ND1, and a gate connected to the first output terminal P4. The voltage VOUT1 is applied from the first output terminal P4 to the gate of the transistor N1. The node ND1 is connected to the second output terminal P5.

The first control circuit CTL1 is a circuit configured to control the driving circuit DRV. The first control circuit CTL1 is connected to the power supply voltage terminal P1, the input terminal P3, and a node ND2. The voltage VDD is applied from the power supply voltage terminal P1 to the first control circuit CTL1. The voltage VIN is applied from the input terminal P3 to the first control circuit CTL1. The first control circuit CTL1 outputs a voltage based on the voltage VIN to the node ND2. In the case of the voltage VIN at the "H" level, the first control circuit CTL1 outputs a voltage at the "H" level. On the other hand, in the case of the voltage VIN at the "L" level, the first control circuit CTL1 outputs a voltage at the "L" level. A voltage at the "L" level output from the first control circuit CTL1 is, for example, the voltage GND.

The driving circuit DRV is a circuit configured to drive the transistor N1. The driving circuit DRV is connected to the node ND2 and the first output terminal P4. A voltage (hereinafter, referred to as a "voltage Vnd2") of the node ND2 is applied to the driving circuit DRV. The driving circuit DRV outputs a voltage based on the voltage Vnd2 to the first output terminal P4. In the case of the voltage VIN (voltage Vnd2) at the "H" level, the driving circuit DRV outputs a voltage at the "H" level. On the other hand, in the case of the voltage VIN (voltage Vnd2) at the "L" level, the driving circuit DRV outputs a voltage at the "L" level. A voltage output from the driving circuit DRV is applied as the voltage VOUT1 to the gate of the transistor N1 via the first output terminal P4. A voltage at the "L" level output from the driving circuit DRV is, for example, the voltage GND.

The clamp circuit 10 is a circuit that clamps a voltage (hereinafter, referred to as a "voltage Vnd1") of the node ND1 in such a manner that the voltage Vnd1 does not drop beyond a breakdown voltage (for example, 40 V) between the drain and the source of the transistor N1 from the voltage VDD when the voltage VIN makes a transition from the "H" level to the "L" level. The clamp circuit 10 is connected to a node ND3, the first output terminal P4, and the second output terminal P5. The clamp circuit 10 will be described later in detail.

The disconnection protection circuit 20 is a circuit that protects the transistor N1 in such a manner as to prevent a situation in which the ground voltage terminal P2 becomes unstable and the transistor N1 is unintentionally turned on, thereby generating heat and breaking down while an interconnect that connects the ground voltage terminal P2 to the GND power supply is disconnected. A period of time when an interconnect that connects the ground voltage terminal P2 to the GND power supply is disconnected indicates a period of time when the ground voltage terminal P2 is not electrically connected to the GND power supply. In the case of the vehicle-mounted system, for example, the aforementioned period of time indicates a period of time when the connector for the voltage GND of the vehicle battery is disconnected from the ground voltage terminal P2. Hereinafter, a state in which the interconnect that connects the ground voltage terminal P2 to the GND power supply is disconnected will be referred to as a "GND disconnection state", and a state in which such an interconnect is not disconnected will be referred to as a "GND non-disconnection state". The disconnection protection circuit 20 is connected to the power supply voltage terminal P1, the ground voltage terminal P2, the input terminal P3, the first output terminal P4, and the second output terminal P5. The disconnection protection circuit 20 will be described later in detail.

The switching control circuit 30 is a circuit that controls switching between connection and disconnection between the ground voltage terminal P2 and the clamp circuit 10. The switching control circuit 30 is connected to the power supply voltage terminal P1, the ground voltage terminal P2, and the nodes ND2 and ND3. The switching control circuit 30 will be described later in detail.

The resistance element R6 has one end connected to the first output terminal P4 and the other end connected to the second output terminal P5. The resistance element R6 is provided in order to prevent the transistor N1 from being turned on when the voltage VIN is at the "L" level.

The resistance element R10 has one end connected to the power supply voltage terminal P1 and the other end connected to the ground voltage terminal P2. The resistance element R10 indicates a resistance of a circuit (not shown) provided between the power supply voltage terminal P1 and the ground voltage terminal P2.

The load LD includes, for example, the resistance element R1 and an inductor L1. The resistance element R1 has one end connected to the node ND1 and the other end grounded. The inductor L1 has one end connected to the node ND1 and the other end grounded.

1.1.2 Configuration of Clamp Circuit

A circuit configuration of the clamp circuit 10 will be described.

As shown in FIG. 1, the clamp circuit 10 includes a diode D1 and zener diodes ZD1 to ZD3.

The diode D1 has an anode connected to the node ND3 and a cathode connected to the node ND4. A forward voltage Vf of the diode D1 is, for example, 0.7 V.

The diode ZD1 has an anode connected to the first output terminal P4 and a cathode connected to the node ND4. A reverse voltage (breakdown voltage) Vz1 of the diode ZD1 is, for example, 6 V.

The diode ZD2 has an anode connected to a node ND5 and a cathode connected to the first output terminal P4. A reverse voltage Vz2 of the diode ZD2 is, for example, 6 V.

The diode ZD3 has an anode connected to the second output terminal P5 and a cathode connected to the node ND5. A reverse voltage Vz3 of the diode ZD3 is, for example, 6 V.

The diode D1 and the zener diodes ZD1 to ZD3 are provided in order to clamp the voltage Vnd1 of the node ND1. The number of zener diodes is not limited to three.

1.1.3 Configuration of Disconnection Protection Circuit

A circuit configuration of the disconnection protection circuit 20 will be described.

As shown in FIG. 1, the disconnection protection circuit 20 includes a second control circuit CTL2, NMOS transistors N2 and N3, and resistance elements R2 to R5.

The second control circuit CTL2 is a circuit that controls the transistors N2 and N3. The second control circuit CTL2 is connected to the power supply voltage terminal P1, the ground voltage terminal P2, the input terminal P3, and a node ND6. The voltage VDD is applied from the power supply voltage terminal P1 to the second control circuit CTL2. The voltage GND is applied from the ground voltage terminal P2 to the second control circuit CTL2. The voltage VIN is applied from the input terminal P3 to the second control circuit CTL2. The second control circuit CTL2 outputs a voltage based on the voltage VIN to the node ND6. In the case of the voltage VIN at the "H" level, the second control circuit CTL2 outputs a voltage at the "H" level. On the other hand, in the case of the voltage VIN at the "L" level, the second control circuit CTL2 outputs a voltage at the "L" level. A voltage at the "L" level output from the second control circuit CTL2 is, for example, the voltage GND. In the case where a voltage difference between the power supply voltage terminal P1 and the ground voltage terminal P2 is smaller than a voltage value that enables the second control circuit CTL2 to be driven (for example, a case where the ground voltage terminal P2 is in the GND disconnection state), the second control circuit CTL2 outputs a voltage at the "L" level.

The transistor N2 has one end connected to a node ND7, the other end connected to the second output terminal P5, and a gate connected to the node ND6.

The transistor N3 has one end connected to a node ND8, the other end connected to the second output terminal P5, and a gate connected to the node ND7.

The resistance element R2 has one end connected to the node ND6 and the other end connected to the second output terminal P5. The resistance element R2 is provided to turn on the transistor N2 when a voltage of the node ND6 (hereinafter, referred to as a "voltage Vnd6") is at the "H" level.

The resistance element R3 has one end connected to the power supply voltage terminal P1 and the other end connected to the node ND7.

The resistance element R4 has one end connected to the node ND7 and the other end connected to the second output terminal P5.

The resistance elements R3 and R4 are provided to apply, to the gate of the transistor N3, a voltage obtained by dividing a voltage between the power supply voltage terminal P1 and the second output terminal P5. The resistance elements R3 and R4 are provided to turn on the transistor N3 when the transistor N2 is turned off.

The resistance element R5 has one end connected to the first output terminal P4 and the other end connected to the node ND8. The resistance element R5 is provided to quickly turn off the transistor N1 by rapidly extracting a charge from the gate of the transistor N1 to the second output terminal P5 when the transistor N3 is turned on. A resistance value of the resistance element R5 is lower than that of the resistance element R6.

1.1.4 Configuration of Switching Control Circuit

A circuit configuration of the switching control circuit 30 will be described.

As shown in FIG. 1, the switching control circuit 30 includes an inverter circuit INV1, flip-flop (FF) circuits FF1 and FF2, a timer circuit TMR, NMOS transistors N4 to N6, and resistance elements R7 to R9.

The inverter circuit INV1 has an input terminal connected to the node ND2 and an output terminal connected to a node ND9.

The FF circuit FF1 is, for example, a D flip-flop. The FF circuit FF1 has three input terminals (CLK, D, and R) and two output terminals (Q and QN). The FF circuit FF1 has the terminal CLK connected to the node ND2, the terminal D to which a voltage VREG is applied, and the terminal R connected to a node ND10. The voltage VREG is a voltage at the "H" level. The terminal R is a terminal for resetting values of the terminals Q and QN. The FF circuit FF1 has the terminal QN connected to a node ND11.

The FF circuit FF1 fetches the voltage VREG into the terminal D when the voltage Vnd2 of the node ND2 applied to the terminal CLK rises from the "L" level to the "H" level. The FF circuit FF1 outputs the value fetched into the terminal D from the terminal Q and outputs a value obtained by inverting the value of the terminal Q from the terminal QN.

The FF circuit FF1 resets the values of the terminals Q and QN to the "L" level and the "H" level, respectively, when a voltage at the "H" level is applied to the terminal R.

The FF circuit FF2 is, for example, a D flip-flop. The FF circuit FF2 has a configuration similar to that of the FF circuit FF1. The FF circuit FF2 has a terminal CLK connected to the node ND9, a terminal D to which the voltage VREG is applied, and a terminal R connected to the node ND11. A terminal Q of the FF circuit FF2 is connected to a node ND12.

The FF circuit FF2 fetches the voltage VREG into the terminal D when a voltage of the node ND9 applied to the terminal CLK rises from the "L" level to the "H" level. The FF circuit FF2 outputs the value fetched into the terminal D from the terminal Q and outputs a value obtained by inverting the value of the terminal Q from a terminal QN.

The FF circuit FF2 resets the values of the terminals Q and QN to the "L" level and the "H" level, respectively, when a voltage at the "H" level is applied to the terminal R.

The timer circuit TMR is a circuit that measures a period of time and controls a timing for resetting values of the terminals Q and QN of the FF circuit FF1. The timer circuit TMR is connected to the nodes ND10 and ND12. The timer circuit TMR outputs a voltage based on a voltage of the node ND12 (hereinafter, referred to as a "voltage Vnd12") to the node ND10. In the case of resetting values of the terminals Q and QN of the FF circuit FF1, the timer circuit TMR outputs a voltage at the "H" level. On the other hand, in the case of not resetting the values of the terminals Q and QN of the FF circuit FF1, the timer circuit TMR outputs a voltage at the "L" level.

For example, the timer circuit TMR outputs a voltage at the "H" level after a certain period of time has elapsed from transition of the voltage Vnd12 of the node ND12 to the "H" level. The certain period of time is preset in consideration of a period of time required for the voltage Vnd1 of the node ND1 to return from the voltage VDD to the voltage GND when the voltage VIN makes a transition from the "H" level to the "L" level. For example, the certain period of time is longer than a period of time required for the voltage Vnd1 of the node ND1 to return from the voltage VDD to the voltage GND when the voltage VIN makes a transition from the "H" level to the "L" level.

The transistor N4 has one end connected to a node ND13, the other end connected to the node ND3, and a gate connected to the node ND12.

The transistor N5 has one end connected to a node ND14, the other end connected to the node ND3, and a gate connected to the node ND13.

The transistor N6 has one end connected to the ground voltage terminal P2, the other end connected to the node ND3, and a gate connected to the node ND14. The transistor N6 is provided to switch between connection and disconnection between the ground voltage terminal P2 and the clamp circuit 10.

The resistance element R7 has one end connected to the node ND12 and the other end connected to the node ND3. The resistance element R7 is provided to turn on the transistor N4 when the voltage Vnd12 of the node ND12 is at the "H" level.

The resistance element R8 has one end connected to the power supply voltage terminal P1 and the other end connected to the node ND13. The resistance element R8 is provided to turn on the transistor N5 when the transistor N4 is turned off.

The resistance element R9 has one end connected to the power supply voltage terminal P1 and the other end connected to the node ND14. The resistance element R9 is provided to turn on the transistor N6 when the transistor N5 is turned off.

1.2 Operation

An operation of the semiconductor device 1 according to the present embodiment will be described. The operation performed by the semiconductor device 1 includes a first operation and a second operation. The first operation is an operation for controlling a source voltage of the transistor N1 (the voltage Vnd1 of the node ND1) when the voltage VIN makes a transition from the "H" level to the "L" level. The second operation is an operation for controlling a gate voltage of the transistor N1 (the voltage VOUT1 of the first output terminal P4) when the ground voltage terminal P2 is in the GND disconnection state.

Figure 2:
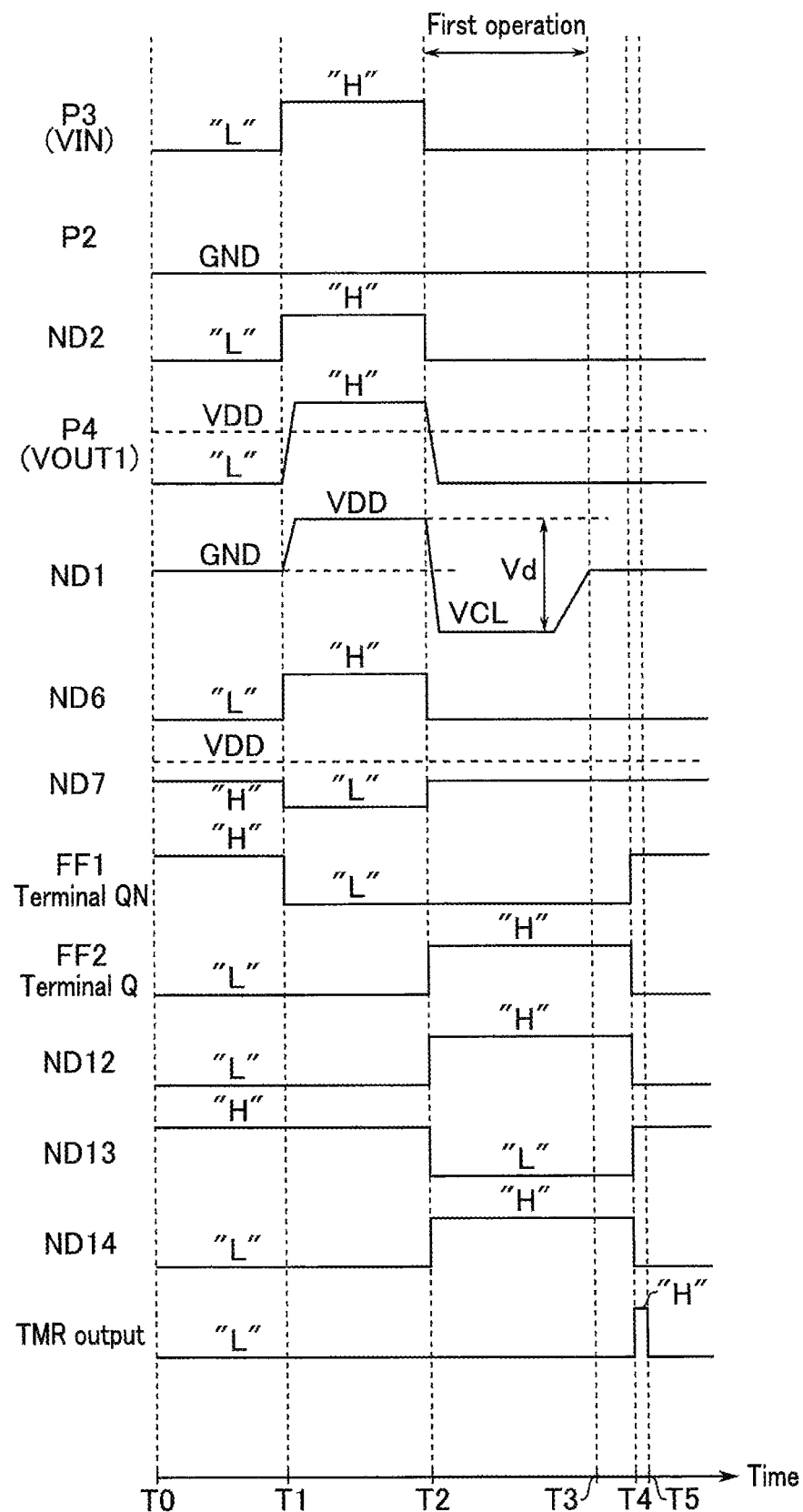
FIG. 2 is a timing chart showing voltages of various terminals, etc., during operation of the semiconductor device according to the first embodiment.
Figure 3:
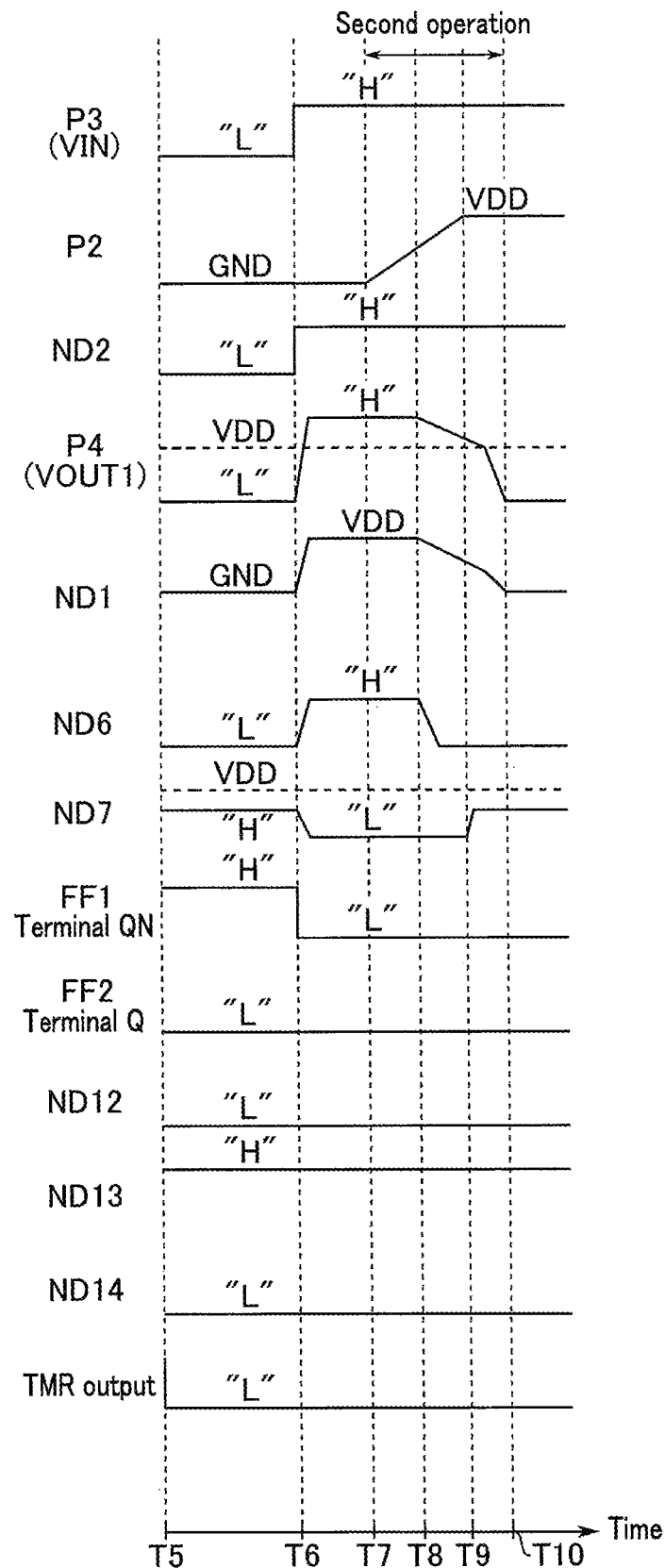
FIG. 3 is a timing chart showing voltages of various terminals, etc., during operation of the semiconductor device according to the first embodiment.

Voltages of various terminals, etc., during operation of the semiconductor device 1 will be described with reference to FIG. 2 and FIG. 3. FIG. 2 and FIG. 3 are timing charts showing voltages of various terminals, etc., during operation of the semiconductor device 1. The following will describe a case in which the ground voltage terminal P2 is in the GND non-disconnection state with the outside during a period from time T0 to time T7, and enters the GND connection state with the outside at the time T7.

As shown in FIG. 2, the voltage VIN at the "L" level (for example, the voltage GND) is supplied to the input terminal P3 during a period from the time T0 to the time T1. The voltage GND is supplied to the ground voltage terminal P2.

The first control circuit CTL1 outputs a voltage at the "L" level based on the voltage VIN ("L" level) to the node ND2. The voltage Vnd2 of the node ND2 becomes a voltage at the "L" level (for example, the voltage GND).

In the FF circuit FF1, the voltage Vnd2 ("L" level) of the node ND2 is applied to the terminal CLK, the voltage VREG is applied to the terminal D, and a voltage at the "L" level is applied from the timer circuit TMR to the terminal R. Accordingly, a voltage at the "H" level is output from the terminal QN of the FF circuit FF1 to the node ND11. A voltage of the node ND11 becomes a voltage at the "H" level.

The voltage Vnd2 ("L" level) of the node ND2 is applied to the input terminal of the inverter circuit INV1. The inverter circuit INV1 outputs a voltage at the "H" level to the node ND9. A voltage of the node ND9 becomes a voltage at the "H" level.

In the FF circuit FF2, the voltage ("H" level) of the node ND9 is applied to the terminal CLK, the voltage VREG is applied to the terminal D, and the voltage ("H" level) of the node ND11 is applied to the terminal R. Accordingly, values of the terminals Q and QN of the FF circuit FF2 are reset to the "L" level and the "H" level, respectively. A voltage at the "L" level (for example, the voltage GND) is output from the terminal Q of the FF circuit FF2 to the node ND12. The voltage Vnd12 of the node ND12 becomes a voltage at the "L" level (for example, the voltage GND). Accordingly, the transistor N4 is turned off. A voltage of the node ND13 becomes a voltage at the "H" level. Accordingly, the transistor N5 is turned on. A voltage of the node ND14 becomes a voltage at the "L" level (for example, the voltage GND). Accordingly, the transistor N6 is turned off.

The timer circuit TMR outputs a voltage at the "L" level (for example, the voltage GND) to the node ND10. A voltage of the node ND10 becomes a voltage at the "L" level.

The second control circuit CTL2 outputs a voltage at the "L" level based on the voltage VIN ("L" level) to the node ND6. The voltage Vnd6 of the node ND6 becomes a voltage at the "L" level (for example, the voltage GND). Accordingly, the transistor N2 is turned off. A voltage of the node ND7 becomes a voltage at the "H" level (for example, a voltage to turn on the transistor N3). Accordingly, the transistor N3 is turned on.

The driving circuit DRV outputs a voltage at the "L" level to the first output terminal P4 based on the voltage Vnd2 ("L" level) of the node ND2. The voltage VOUT1 of the first output terminal P4 becomes a voltage at the "L" level (for example, the voltage GND). The voltage VOUT1 ("L" level) is applied from the first output terminal P4 to the gate of the transistor N1. Accordingly, the transistor N1 is turned off. The voltage VDD is not supplied from the power supply voltage terminal P1 to the load LD. Accordingly, the voltage Vnd1 of the node ND1 becomes the voltage GND. The voltage VOUT2 of the second output terminal P5 becomes the voltage GND.

No current flows through the diodes D1 and ZD1 to ZD3.

At time T1, the voltage VIN at the "H" level is supplied to the input terminal P3.

The first control circuit CTL1 outputs a voltage at the "H" level based on the voltage VIN ("H" level) to the node ND2. The voltage Vnd2 of the node ND2 becomes a voltage at the "H" level.

In the FF circuit FF1, the voltage Vnd2 ("H" level) of the node ND2 is applied to the terminal CLK, the voltage VREG is applied to the terminal D, and a voltage at the "L" level is applied from the timer circuit TMR to the terminal R. Accordingly, a voltage at the "L" level (for example, the voltage GND) is output from the terminal QN of the FF circuit FF1 to the node ND11. A voltage of the node ND11 becomes a voltage at the "L" level.

The voltage Vnd2 ("H" level) of the node ND2 is applied to the input terminal of the inverter circuit INV1. The inverter circuit INV1 outputs a voltage at the "L" level to the node ND9. A voltage of the node ND9 becomes a voltage at the "L" level.

In the FF circuit FF2, the voltage ("L" level) of the node ND9 is applied to the terminal CLK, the voltage VREG is applied to the terminal D, and the voltage ("L" level) of the node ND11 is applied to the terminal R. Accordingly, a voltage at the "L" level is output from the terminal Q of the FF circuit FF2 to the node ND12. The voltage Vnd12 of the node ND12 becomes a voltage at the "L" level. Accordingly, the transistor N4 is turned off. A voltage of the node ND13 becomes a voltage at the "H" level. Accordingly, the transistor N5 is turned on. A voltage of the node ND14 becomes a voltage at the "L" level. Accordingly, the transistor N6 is turned off.

The timer circuit TMR outputs a voltage at the "L" level to the node ND10. A voltage of the node ND10 becomes a voltage at the "L" level.

The second control circuit CTL2 outputs a voltage at the "H" level based on the voltage VIN ("H" level) to the node ND6. A voltage Vnd6 of the node ND6 becomes a voltage at the "H" level (for example, a voltage to turn on the transistor N2). Accordingly, the transistor N2 is turned on. A voltage of the node ND7 becomes a voltage at the "L" level (for example, the voltage GND). Accordingly, the transistor N3 is turned off.

The driving circuit DRV outputs a voltage at the "H" level to the first output terminal P4 based on the voltage Vnd2 ("H" level) of the node ND2. The voltage VOUT1 of the first output terminal P4 becomes a voltage at the "H" level (for example, a voltage higher than the voltage VDD). The voltage VOUT1 ("H" level) is applied from the first output terminal P4 to the gate of the transistor N1. Accordingly, the transistor N1 is turned on. The voltage VDD is supplied from the power supply voltage terminal P1 to the load LD.

Accordingly, the voltage Vnd1 of the node ND1 becomes the voltage VDD. Magnetic energy is stored in the inductor L1. The voltage VOUT2 of the second output terminal P5 becomes the voltage VDD.

No current flows through the diodes D1 and ZD1 to ZD3.

At the time T2, the voltage VIN at the "L" level is supplied to the input terminal P3.

The first control circuit CTL1 outputs a voltage at the "L" level based on the voltage VIN ("L" level) to the node ND2. The voltage Vnd2 of the node ND2 becomes a voltage at the "L" level.

In the FF circuit FF1, the voltage Vnd2 ("L" level) of the node ND2 is applied to the terminal CLK, the voltage VREG is applied to the terminal D, and a voltage at the "L" level is applied from the timer circuit TMR to the terminal R. Accordingly, a voltage at the "L" level is output from the terminal QN of the FF circuit FF1 to the node ND11. A voltage of the node ND11 becomes a voltage at the "L" level.

The voltage Vnd2 ("L" level) of the node ND2 is applied to the input terminal of the inverter circuit INV1. The inverter circuit INV1 outputs a voltage at the "H" level to the node ND9. A voltage of the node ND9 becomes a voltage at the "H" level.

In the FF circuit. FF2, the voltage ("H" level) of the node ND9 is applied to the terminal CLK, the voltage VREG is applied to the terminal D, and the voltage ("L" level) of the node ND11 is applied to the terminal R. Accordingly, a voltage at the "H" level is output from the terminal Q of the FF circuit FF2 to the node ND12. The voltage Vnd12 of the node ND12 becomes a voltage at the "H" level. Accordingly, the transistor N4 is turned on. A voltage of the node ND13 becomes a voltage at the "L" level (for example, the voltage GND). Accordingly, the transistor N5 is turned off. A voltage of the node ND14 becomes a voltage at the "H" level. Accordingly, the transistor N6 is turned on.

The timer circuit TMR outputs a voltage at the "L" level to the node ND10. A voltage of the node ND10 becomes a voltage at the "L" level.

As described above, the switching control circuit 30 electrically connects the ground voltage terminal P2 to the clamp circuit 10 when the voltage VIN makes a transition from the "H" level to the "L" level (when the transistor N1 makes a transition from the ON state to the OFF state).

The second control circuit CTL2 outputs a voltage at the "L" level based on the voltage VIN ("L" level) to the node ND6. The voltage Vnd6 of the node ND6 becomes a voltage at the "L" level. Accordingly, the transistor N2 is turned off. A voltage of the node ND7 becomes a voltage at the "H" level. Accordingly, the transistor N3 is turned on.

The driving circuit DRV outputs a voltage at the "L" level to the first output terminal P4 based on the voltage Vnd2 ("L" level) of the node ND2. The voltage VOUT1 of the first output terminal P4 becomes a voltage at the "L" level. The voltage VOUT1 ("L" level) is applied from the first output terminal P4 to the gate of the transistor N1. Accordingly, the transistor N1 is turned off. The voltage VDD is not supplied from the power supply voltage terminal P1 to the load LD. By this, the voltage Vnd1 of the node ND1 drops to a negative voltage by the inductor L1 releasing magnetic energy.

When the voltage Vnd1 of the node ND1 becomes a negative voltage, because of the transistor N6 being in the ON state, a current starts to flow from the ground voltage terminal P2 to the node ND1 through the diodes D1, ZD1, ZD2, and ZD3 and the second output terminal P5. Thereafter, a drop in the voltage Vnd1 of the node ND1 stops. The voltage at this time will be referred to as a "clamp voltage VCL". The clamp voltage is determined depending on the voltage Vf, the voltage Vz1, the voltage Vz2, and the voltage Vz3. The clamp voltage VCL is lower than the voltage GND by a sum of the voltage Vf, the voltage Vz1, the voltage Vz2, and the voltage Vz3 (voltage Vf+voltage Vz1+voltage Vz2+voltage Vz3). The clamp voltage VCL is set such that a voltage difference Vd between the voltage VDD and the voltage VCL becomes smaller than the breakdown voltage between the drain and the source of the transistor N1.

When the inductor L1 completes releasing of magnetic energy, a current no longer flows from the ground voltage terminal P2 to the node ND1 through the diodes D1, ZD1, ZD2, and ZD3 and the second output terminal P5. Accordingly, the voltage Vnd1 of the node ND1 increases.

At the time T3, the voltage Vnd1 of the node ND1 becomes the voltage GND. The voltage VOUT2 of the second output terminal P5 becomes the voltage GND.

As described above, the clamp circuit 10 controls the voltage Vnd1 of the node ND1 based on a voltage of the ground voltage terminal P2. The operation from the time T2 to the time T3 corresponds to the first operation.

At the time T4, the timer circuit TMR outputs a voltage at the "H" level to the node ND10. A voltage of the node ND10 becomes a voltage at the "H" level. The time T4 is, for example, the time after a certain period of time has elapsed from the time T2, that is, the time after a certain period of time has elapsed from transition of the voltage Vnd12 of the node ND12 to the "H" level.

The first control circuit CTL1 outputs a voltage at the "L" level based on the voltage VIN ("L" level) to the node ND2. The voltage Vnd2 of the node ND2 becomes a voltage at the "L" level.

In the FF circuit FF1, the voltage Vnd2 ("L" level) of the node ND2 is applied to the terminal CLK, the voltage VREG is applied to the terminal D, and a voltage at the "H" level is applied from the timer circuit TMR to the terminal R. Accordingly, values of the terminals Q and QN of the FF circuit FF1 are reset to the "L" level and the "H" level, respectively. The voltage at the "H" level is output from the terminal QN of the FF circuit FF1 to the node ND11. A voltage of the node ND11 becomes a voltage at the "H" level.

The voltage Vnd2 ("L" level) of the node ND2 is applied to the input terminal of the inverter circuit INV1. The inverter circuit INV1 outputs a voltage at the "H" level to the node ND9. A voltage of the node ND9 becomes a voltage at the "H" level.

In the FF circuit FF2, the voltage ("H" level) of the node ND9 is applied to the terminal CLK, the voltage VREG is applied to the terminal D, and the voltage ("H" level) of the node ND11 is applied to the terminal R. Accordingly, values of the terminals Q and QN of the FF circuit FF2 are reset to the "L" level and the "H" level, respectively. A voltage at the "L" level is output from the terminal Q of the FF circuit FF2 to the node ND12. The voltage Vnd12 of the node ND12 becomes a voltage at the "L" level. Accordingly, the transistor N4 is turned off. A voltage of the node ND13 becomes a voltage at the "H" level. Accordingly, the transistor N5 is turned on. A voltage of the node ND14 becomes a voltage at the "L" level. Accordingly, the transistor N6 is turned off.

The timer circuit TMR outputs a voltage at the "L" level to the node ND10. A voltage of the node ND10 becomes a voltage at the "L" level.

As described above, the switching control circuit 30 electrically connects the ground voltage terminal P2 to the clamp circuit 10, and upon elapse of a predetermined period of time, electrically disconnects the ground voltage terminal P2 from the clamp circuit 10. In other words, the switching control circuit 30 electrically disconnects the ground voltage terminal P2 from the clamp circuit 10 based on a voltage at the "H" level output by the timer circuit TMR (the voltage indicating that a predetermined period of time has elapsed).

The second control circuit CTL2 outputs a voltage at the "L" level based on the voltage VIN ("L" level) to the node ND6. The voltage Vnd6 of the node ND6 becomes a voltage at the "L" level. Accordingly, the transistor N2 is turned off. A voltage of the node ND7 becomes a voltage at the "H" level. Accordingly, the transistor N3 is turned on.

The driving circuit DRV outputs a voltage at the "L" level to the first output terminal P4 based on the voltage Vnd2 ("L" level) of the node ND2. The voltage VOUT1 of the first output terminal P4 becomes a voltage at the "L" level. The voltage VOUT1 ("L" level) is applied from the first output terminal P4 to the gate of the transistor N1. Accordingly, the transistor N1 is turned off. The voltage VDD is not supplied from the power supply voltage terminal P1 to the load LD. Accordingly, the voltage Vnd1 of the node ND1 becomes the voltage GND. The voltage VOUT2 of the second output terminal P5 becomes the voltage GND.

No current flows through the diodes D1 and ZD1 to ZD3.

As shown in FIG. 3, at the time T5, the timer circuit TMR outputs a voltage at the "L" level to the node ND10. A voltage of the node ND10 becomes a voltage at the "L" level.

The operation of the semiconductor device 1 from the time T5 to the time T6 is similar to that from the time T0 to the time T1.

At the time T6, the voltage VIN at the "H" level is supplied to the input terminal P3.

The operation of the semiconductor device 1 from the time T6 to the time T7 is similar to that from the time T1 to the time T2.

At the time T7, the ground voltage terminal P2 enters the GND disconnection state. At this time, the transistor N6 is in the OFF state. That is, the switching control circuit 30 electrically disconnects the ground voltage terminal P2 from the clamp circuit 10.

When the ground voltage terminal P2 enters the GND disconnection state, a voltage of the ground voltage terminal P2 becomes unstable. Because of the transistor N6 being in the OFF state, a voltage of the ground voltage terminal P2 rises up to the voltage VDD.

At the time T8, the voltage difference between the power supply voltage terminal P1 and the ground voltage terminal P2 becomes smaller than a voltage value that enables the second control circuit CTL2 to be driven. Accordingly, the second control circuit CTL2 outputs a voltage at the "L" level to the node ND6. The voltage Vnd6 of the node ND6 becomes a voltage at the "L" level. Accordingly, the transistor N2 is turned off.

At the time T9, a voltage of the node ND7 becomes a voltage at the "H" level. Accordingly, the transistor N3 is turned on. A charge is rapidly extracted from the gate of the transistor N1 to the second output terminal P5. Accordingly, a voltage of the gate of the transistor N1 drops quickly.

At the time T10, a voltage of the gate of the transistor N1 becomes the voltage GND. Accordingly, the transistor N1 is turned off. In other words, the voltage VOUT1 of the first output terminal P4 becomes a voltage for turning off the transistor N1. The voltage VDD is not supplied from the power supply voltage terminal P1 to the load LD. Accordingly, the voltage Vnd1 of the node ND1 becomes the voltage GND. The voltage VOUT2 of the second output terminal P5 becomes the voltage GND.

The rest of the operation of the semiconductor device 1 from the time T7 to the time T10 is similar to that from the time T1 to the time T2.

As described above, the disconnection protection circuit 20 controls a voltage of the first output terminal P4 based on a voltage of the ground voltage terminal P2 and a voltage of the input terminal P3. The operation from the time T7 to the time. T10 corresponds to the second operation.

1.3 Advantageous Effects

The configuration according to the present embodiment can suppress a malfunction of the semiconductor device. Hereinafter, the advantageous effects will be described.

While the ground voltage terminal P2 is in the GND disconnection state, a voltage of the ground voltage terminal P2 becomes unstable. At this time, in the case where the ground voltage terminal P2 and the clamp circuit 10 are electrically connected to each other, a voltage of the ground voltage terminal P2 may be clamped by the ground voltage terminal P2 and the node ND1 being electrically connected to each other with the diodes D1, ZD1, ZD2, and ZD3, and the second output terminal P5 intervening therebetween. When a voltage of the ground voltage terminal P2 is clamped, a voltage of the ground voltage terminal P2 may not rise up to the voltage VDD. In such a case, the second control circuit CTL2 outputs a voltage at the "H" level. Accordingly, the transistor N2 is turned on and the transistor N3 is turned off. Accordingly, the transistor N1 may be unintentionally turned on because the gate voltage of the transistor N1 cannot be decreased to a voltage at the "L" level. In such a case, the transistor N1 may generate heat and break down.

On the other hand, in the present embodiment, while the ground voltage terminal P2 is in the GND disconnection state, the transistor N6 is turned off. That is, the ground voltage terminal P2 and the clamp circuit 10 are not electrically connected to each other. In other words, the ground voltage terminal P2 and the node ND1 are not electrically connected to each other with the diodes D1, ZD1, ZD2, and ZD3, and the second output terminal P5 intervening therebetween. For this reason, a voltage of the ground voltage terminal P2 is not clamped. Accordingly, a voltage of the ground voltage terminal P2 rises up to the voltage VDD. When a voltage of the ground voltage terminal P2 rises up to the voltage VDD, the second control circuit CTL2 outputs a voltage at the "L" level. Accordingly, the transistor N2 is turned off and the transistor N3 is turned on. In this manner, the gate voltage of the transistor N1 can be dropped to a voltage at the "L" level and the transistor N1 is turned off. This can prevent the transistor N1 from generating heat and breaking down.

Furthermore, in the present embodiment, when the voltage VIN makes a transition from the "H" level to the "L" level, the transistor N6 is turned on. In other words, the ground voltage terminal P2 and the clamp circuit 10 are electrically connected to each other. In other words, the ground voltage terminal P2 and the node ND1 are electrically connected to each other with the diodes D1, ZD1, ZD2, and ZD3, and the second output terminal P5 intervening therebetween. Therefore, the voltage Vnd1 of the node ND1 is clamped to the clamp voltage VCL. The clamp voltage VCL is set such that the voltage difference Vd between the voltage VDD and the voltage VCL becomes smaller than the breakdown voltage between the drain and the source of the transistor N1. This can prevent the voltage Vnd1 of the node ND1 from dropping beyond the breakdown voltage between the drain and the source of the transistor N1 and prevent the transistor N1 breaking down.

Thus, according to the present embodiment, a malfunction of the semiconductor device can be suppressed.

2. Second Embodiment

A semiconductor device according to a second embodiment will be described. The semiconductor device according to the present embodiment differs from that of the first embodiment in terms of a configuration of a semiconductor device. The following description will in principle concentrate on the features different from the first embodiment.

2.1 Circuit Configuration of Semiconductor Device

Figure 4:
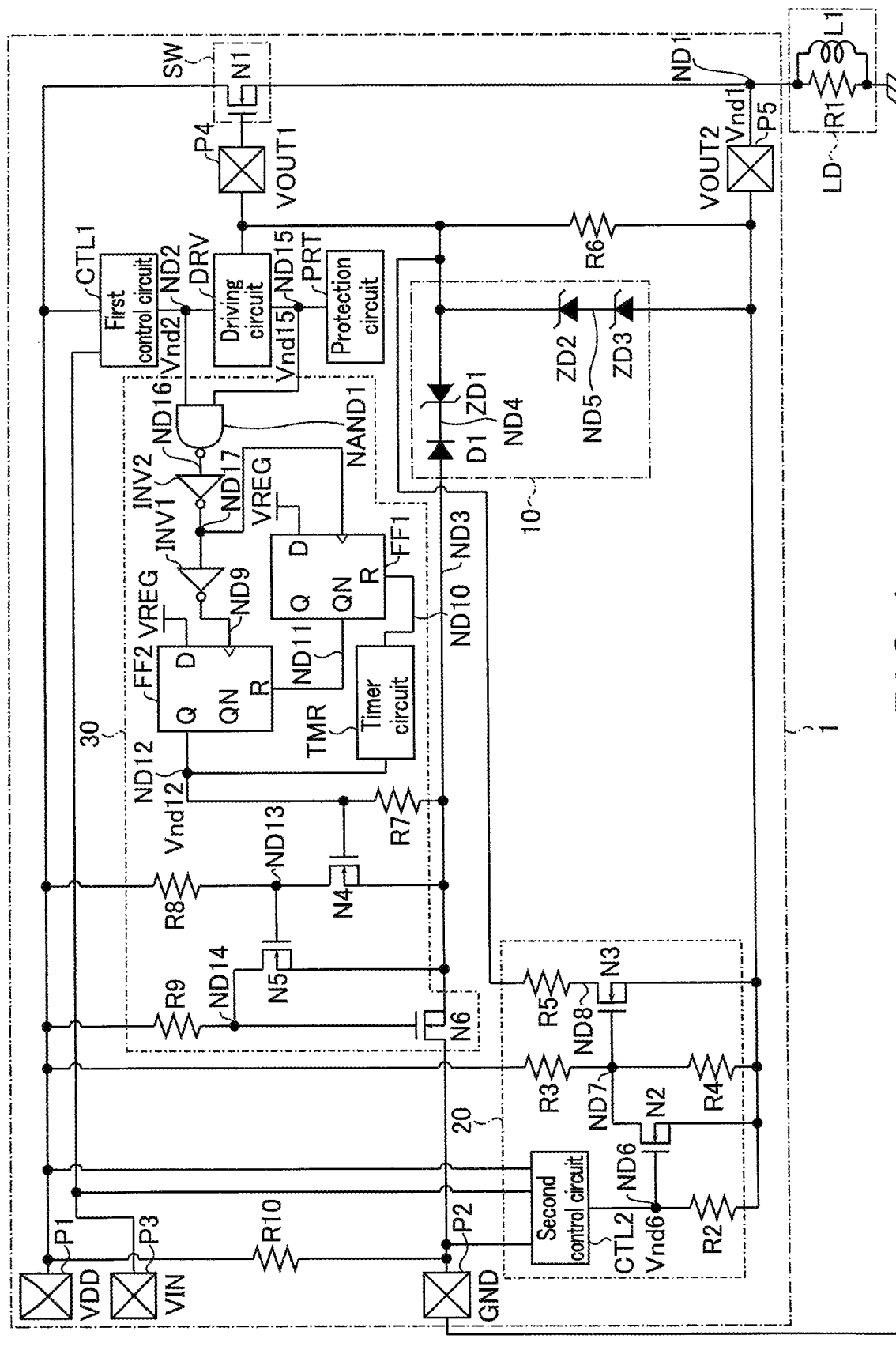
FIG. 4 is a circuit diagram showing an example of a semiconductor device according to a second embodiment.

A circuit configuration of the semiconductor device according to the present embodiment will be described with reference to FIG. 4. FIG. 4 is a circuit diagram showing an example of the semiconductor device.

The semiconductor device 1 includes a protection circuit PRT.

The protection circuit PRT is a circuit configured to protect the semiconductor device 1 upon detection of some kind of abnormality. The protection circuit PRT is, for example, an overheating protection circuit, an overcurrent protection circuit, etc. For example, when the temperature of the semiconductor device 1 becomes higher than a reference value, the overheating protection circuit determines that the semiconductor device 1 has an abnormality (detects an abnormality). For example, when the current flowing through the semiconductor device 1 becomes higher than a reference value, the overcurrent protection circuit determines that the semiconductor device 1 has an abnormality (detects an abnormality). The protection circuit PRT is connected to a node ND15.

The protection circuit PRT outputs a voltage at the High ("H") level or a voltage at the Low ("L") level to the node ND15. In the case where the protection circuit PRT has not detected an abnormality (the case where the semiconductor device 1 is normal), the protection circuit PRT outputs a voltage at the "H" level. On the other hand, in the case where the protection circuit PRT has detected an abnormality (the case where the semiconductor device 1 has an abnormality), the protection circuit PRT outputs a voltage at the "L" level. A voltage at the "L" level is, for example, the voltage GND.

The driving circuit DRV is connected to nodes ND2 and ND15 and the first output terminal P4. The voltage Vnd2 of the node ND2 and a voltage of the node ND15 (hereinafter, referred to as a "voltage Vnd15") are applied to the driving circuit DRV. The driving circuit DRV outputs a voltage based on the voltages Vnd2 and Vnd15 to the first output terminal P4. In the case of the voltage Vnd15 of the node ND15 being at the "H" level, the driving circuit DRV outputs a voltage based on the voltage VIN (voltage Vnd2). On the other hand, in the case of the voltage Vnd15 of the node ND15 being at the "L" level, the drive circuit DRV outputs a voltage at the "L" level.

The switching control circuit 30 is connected to the power supply voltage terminal P1, the ground voltage terminal P2, and the nodes ND2, ND3, and ND15. The switching control circuit 30 will be described later in detail.

The rest of the configuration of the semiconductor device 1, other than the switching control circuit 30, is similar to that of the first embodiment.

2.2 Configuration of Switching Control Circuit

A circuit configuration of the switching control circuit 30 will be described.

As shown in FIG. 4, the switching control circuit 30 includes an NAND circuit NAND1 and an inverter circuit INV2.

The NAND circuit NAND1 has one input terminal connected to the node ND2, the other input terminal connected to the node ND15, and an output terminal connected to a node ND16.

The inverter circuit INV2 has an input terminal connected to the node ND16 and an output terminal connected to a node ND17.

The inverter circuit INV1 has an input terminal connected to the node ND17 and an output terminal connected to the node ND9.

The FF circuit FF1 has the terminal CLK connected to the node ND17, the terminal D to which the voltage VREG is applied, and the terminal R connected to the node ND10. The FF circuit FF1 has the terminal QN connected to the node ND11.

The rest of the configuration of the switching control circuit 30 is similar to that of the first embodiment.

2.3 Operation

An operation of the semiconductor device 1 according to the present embodiment will be described. The operation performed by the semiconductor device 1 includes the first operation, the second operation, and a third operation. The third operation is an operation for controlling the source voltage of the transistor N1 (the voltage Vnd1 of the node ND1) when the protection circuit PRT detects an abnormality.

Figure 5:
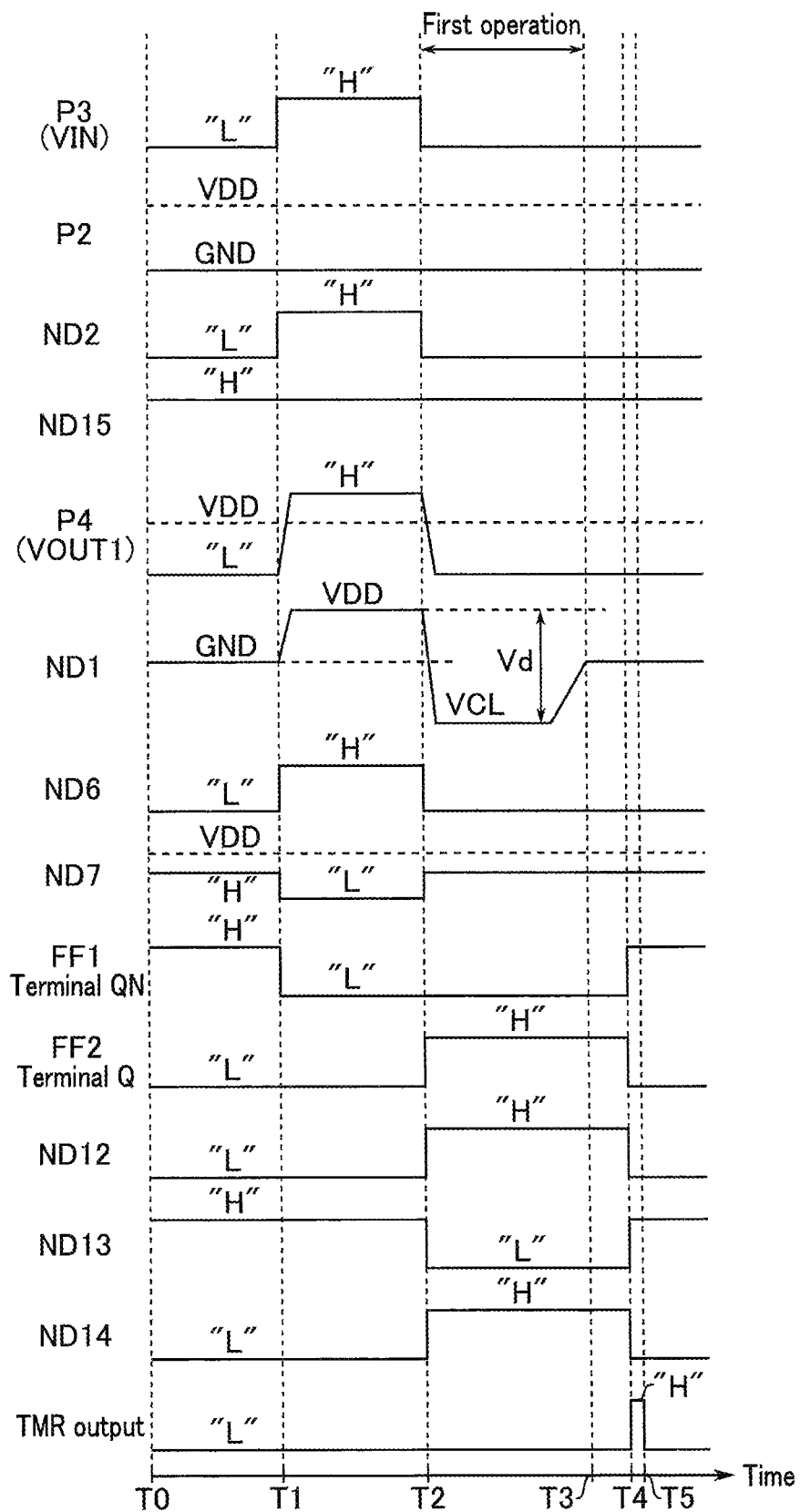
FIG. 5 is a timing chart showing voltages of various terminals, etc., during operation of the semiconductor device according to the second embodiment.
Figure 6:
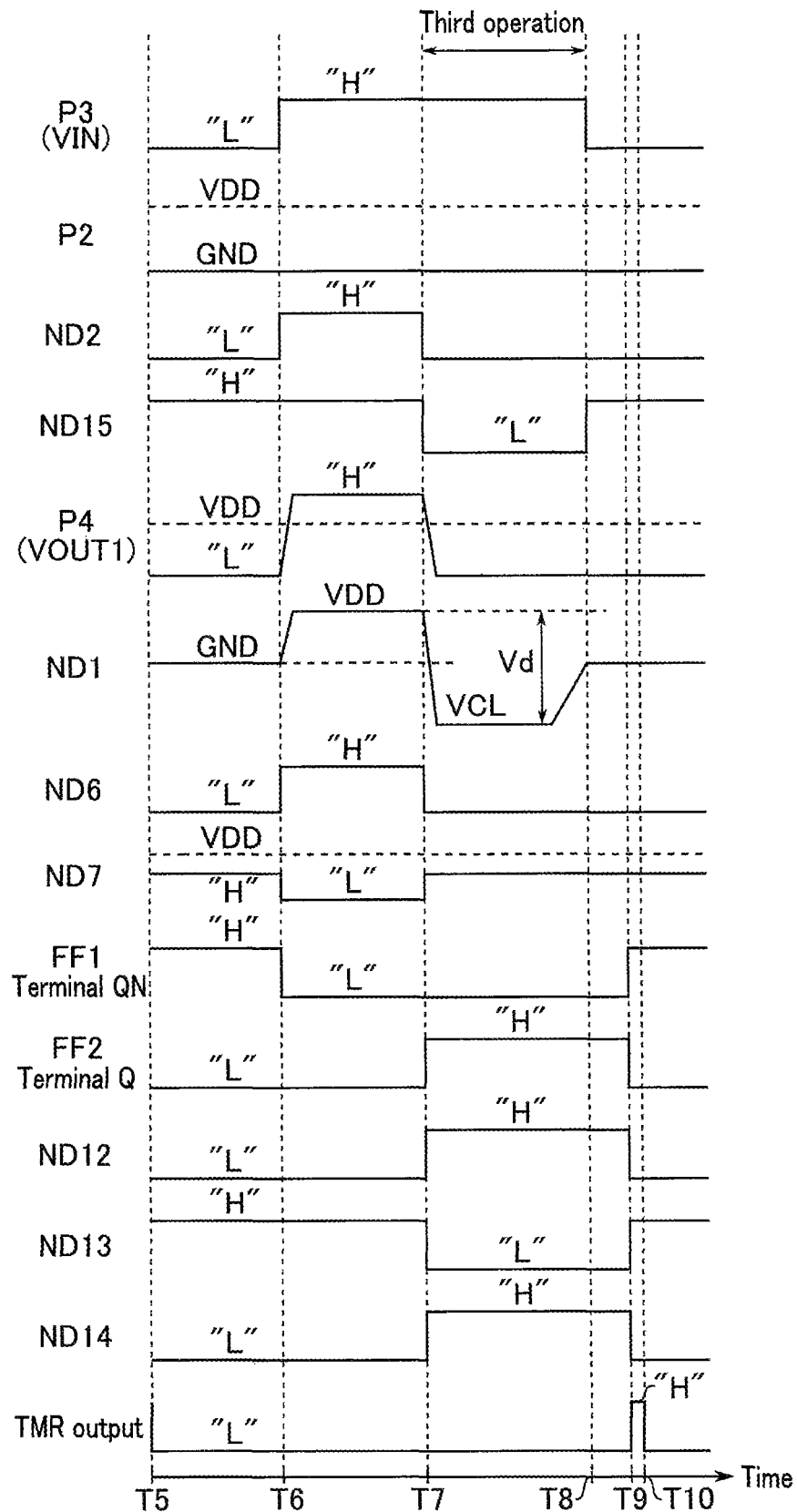
FIG. 6 is a timing chart showing voltages of various terminals, etc., during operation of the semiconductor device according to the second embodiment.
Figure 7:
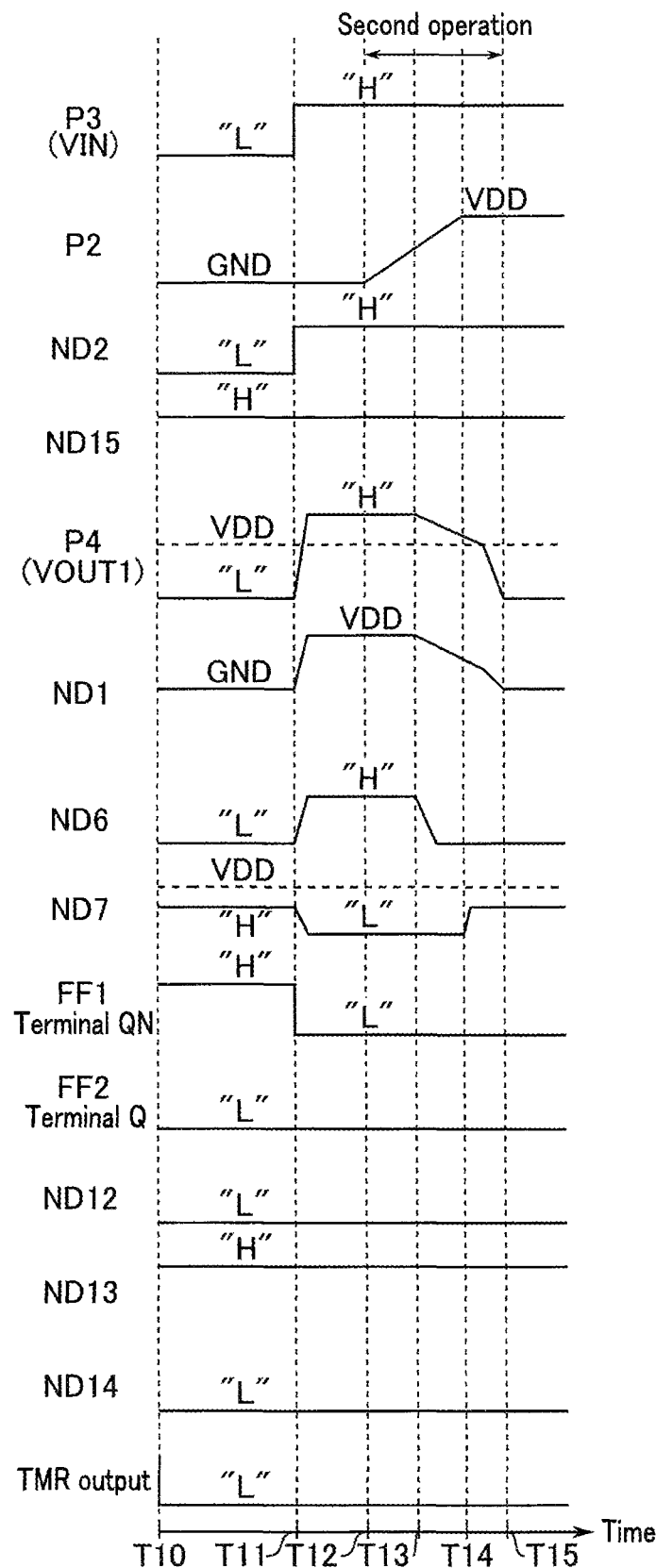
FIG. 7 is a timing chart showing voltages of various terminals, etc., during operation of the semiconductor device according to the second embodiment.

Voltages of various terminals, etc., during operation of the semiconductor device 1 will be described with reference to FIG. 5 to FIG. 7. FIG. 5 to FIG. 7 are timing charts showing voltages of various terminals, etc., during operation of the semiconductor device 1. The following will describe a case in which the ground voltage terminal P2 is in the GND non-disconnection state with the outside during a period from the time T0 to the time T12, the protection circuit PRT detects an abnormality during a period from the time T7 to the time T8, and the ground voltage terminal P2 enters the GND disconnection state with the outside at the time T12.

As shown in FIG. 5, the voltage VIN at the "L" level (for example, the voltage GND) is supplied to the input terminal P3 during a period from the time T0 to the time T1. The voltage GND is supplied to the ground voltage terminal P2.

The first control circuit CTL1 outputs a voltage at the "L" level based on the voltage VIN ("L" level) to the node ND2. The voltage Vnd2 of the node ND2 becomes a voltage at the "L" level (for example, the voltage GND).

The protection circuit PRT outputs a voltage at the "H" level to the node ND15. The voltage Vnd15 of the node ND15 becomes a voltage at the "H" level.

In the NAND circuit NAND1, the voltage Vnd2 ("L" level) of the node ND2 is applied to one input terminal, and the voltage Vnd15 ("H" level) of the node ND15 is applied to the other input terminal. The NAND circuit NAND1 outputs a voltage at the "H" level to the node ND16. A voltage of the node ND16 becomes a voltage at the "H" level.

The voltage ("H" level) of the node ND16 is applied to the input terminal of the inverter circuit INV2. The inverter circuit INV2 outputs a voltage at the "L" level to the node ND17. A voltage of the node ND17 becomes a voltage at the "L" level.

In the FF circuit FF1, the voltage ("L" level) of the node ND17 is applied to the terminal CLK, the voltage VREG is applied to the terminal D, and a voltage at the "L" level is applied from the timer circuit TMR to the terminal R. Accordingly, a voltage at the "H" level is output from the terminal QN of the FF circuit FF1 to the node ND11. A voltage of the node ND11 becomes a voltage at the "H" level.

The voltage ("L" level) of the node ND17 is applied to the input terminal of the inverter circuit INV1. The inverter circuit INV1 outputs a voltage at the "H" level to the node ND9. A voltage of the node ND9 becomes a voltage at the "H" level.

In the FF circuit FF2, the voltage ("H" level) of the node ND9 is applied to the terminal CLK, the voltage VREG is applied to the terminal D, and the voltage ("H" level) of the node ND11 is applied to the terminal R. Accordingly, values of the terminals Q and QN of the FF circuit FF2 are reset to the "L" level and the "H" level, respectively. A voltage at the "L" level (for example, the voltage GND) is output from the terminal Q of the FF circuit FF2 to the node ND12. The voltage Vnd12 of the node ND12 becomes a voltage at the "L" level (for example, the voltage GND). Accordingly, the transistor N4 is turned off. A voltage of the node ND13 becomes a voltage at the "H" level. Accordingly, the transistor N5 is turned on. A voltage of the node ND14 becomes a voltage at the "L" level (for example, the voltage GND). Accordingly, the transistor N6 is turned off.

The timer circuit TMR outputs a voltage at the "L" level (for example, the voltage GND) to the node ND10. A voltage of the node ND10 becomes a voltage at the "L" level.

The second control circuit CTL2 outputs a voltage at the "L" level based on the voltage VIN ("L" level) to the node ND6. The voltage Vnd6 of the node ND6 becomes a voltage at the "L" level (for example, the voltage GND). Accordingly, the transistor N2 is turned off. A voltage of the node ND7 becomes a voltage at the "H" level (for example, a voltage to turn on the transistor N3). Accordingly, the transistor N3 is turned on.

The driving circuit DRV outputs a voltage at the "L" level to the first output terminal P4 based on the voltage Vnd2 ("L" level) of the node ND2 and the voltage Vnd15 ("H" level) of the node ND15. The voltage VOUT1 of the first output terminal P4 becomes a voltage at the "L" level (for example, GND). The voltage VOUT1 ("L" level) is applied from the first output terminal P4 to the gate of the transistor N1. Accordingly, the transistor N1 is turned off. The voltage VDD is not supplied from the power supply voltage terminal P1 to the load LD. Accordingly, the voltage Vnd1 of the node ND1 becomes the voltage GND. The voltage VOUT2 of the second output terminal P5 becomes the voltage GND.

No current flows through the diodes D1 and ZD1 to ZD3.

At time T1, the voltage VIN at the "H" level is supplied to the input terminal P3.

The first control circuit CTL1 outputs a voltage at the "H" level based on the voltage VIN ("H" level) to the node ND2. The voltage Vnd2 of the node ND2 becomes a voltage at the "H" level.

The protection circuit PRT outputs a voltage at the "H" level to the node ND15. The voltage Vnd15 of the node ND15 becomes a voltage at the "H" level.

In the NAND circuit NAND1, the voltage Vnd2 ("H" level) of the node ND2 is applied to one input terminal, and the voltage Vnd15 ("H" level) of the node ND15 is applied to the other input terminal. The NAND circuit NAND1 outputs a voltage at the "L" level to the node ND16. A voltage of the node ND16 becomes a voltage at the "L" level.

The voltage ("L" level) of the node ND16 is applied to the input terminal of the inverter circuit INV2. The inverter circuit INV2 outputs a voltage at the "H" level to the node ND17. A voltage of the node ND17 becomes a voltage at the "H" level.

In the FF circuit FF1, the voltage ("H" level) of the node ND17 is applied to the terminal CLK, the voltage VREG is applied to the terminal D, and a voltage at the "L" level is applied from the timer circuit TMR to the terminal R. Accordingly, a voltage at the "L" level (for example, the voltage GND) is output from the terminal QN of the FF circuit FF1 to the node ND11. A voltage of the node ND11 becomes a voltage at the "L" level.

The voltage ("H" level) of the node ND17 is applied to the input terminal of the inverter circuit INV1. The inverter circuit INV1 outputs a voltage at the "L" level to the node ND9. A voltage of the node ND9 becomes a voltage at the "L" level.

In the FF circuit FF2, the voltage ("L" level) of the node ND9 is applied to the terminal CLK, the voltage VREG is applied to the terminal D, and the voltage ("L" level) of the node ND11 is applied to the terminal R. Accordingly, a voltage at the "L" level is output from the terminal Q of the FF circuit FF2 to the node ND12. The voltage Vnd12 of the node ND12 becomes a voltage at the "L" level. Accordingly, the transistor N4 is turned off. A voltage of the node ND13 becomes a voltage at the "H" level. Accordingly, the transistor N5 is turned on. A voltage of the node ND14 becomes a voltage at the "L" level. Accordingly, the transistor N6 is turned off.

The timer circuit TMR outputs a voltage at the "L" level to the node ND10. A voltage of the node ND10 becomes a voltage at the "L" level.

The second control circuit CTL2 outputs a voltage at the "H" level based on the voltage VIN ("H" level) to the node ND6. The voltage Vnd6 of the node ND6 becomes a voltage at the "H" level (for example, a voltage to turn on the transistor N2). Accordingly, the transistor N2 is turned on. A voltage of the node ND7 becomes a voltage at the "L" level (for example, the voltage GND). Accordingly, the transistor N3 is turned off.

The driving circuit DRV outputs a voltage at the "H" level to the first output terminal P4 based on the voltage Vnd2 ("L" level) of the node ND2 and the voltage Vnd15 ("H" level) of the node ND15. The voltage VOUT1 of the first output terminal P4 becomes a voltage at the "H" level (for example, a voltage higher than the voltage VDD). The voltage VOUT1 ("H" level) is applied from the first output terminal P4 to the gate of the transistor N1. Accordingly, the transistor N1 is turned on. The voltage VDD is supplied from the power supply voltage terminal P1 to the load LD. Accordingly, the voltage Vnd1 of the node ND1 becomes the voltage VDD. Magnetic energy is stored in the inductor L1. The voltage VOUT2 of the second output terminal P5 becomes the voltage VDD.

No current flows through the diodes D1 and ZD1 to ZD3.

At the time T2, the voltage VIN at the "L" level is supplied to the input terminal P3.

The first control circuit CTL1 outputs a voltage at the "L" level based on the voltage VIN ("L" level) to the node ND2. The voltage Vnd2 of the node ND2 becomes a voltage at the "L" level.

The protection circuit PRT outputs a voltage at the "H" level to the node ND15. The voltage Vnd15 of the node ND15 becomes a voltage at the "H" level.

In the NAND circuit NAND1, the voltage Vnd2 ("L" level) of the node ND2 is applied to one input terminal, and the voltage Vnd15 ("H" level) of the node ND15 is applied to the other input terminal. The NAND circuit NAND1 outputs a voltage at the "H" level to the node ND16. A voltage of the node ND16 becomes a voltage at the "H" level.

The voltage ("H" level) of the node ND16 is applied to the input terminal of the inverter circuit INV2. The inverter circuit INV2 outputs a voltage at the "L" level to the node ND17. A voltage of the node ND17 becomes a voltage at the "L" level.

In the FF circuit FF1, the voltage ("L" level) of the node ND17 is applied to the terminal CLK, the voltage VREG is applied to the terminal D, and a voltage at the "L" level is applied from the timer circuit TMR to the terminal R. Accordingly, a voltage at the "L" level is output from the terminal QN of the FF circuit FF1 to the node ND11. A voltage of the node ND11 becomes a voltage at the "L" level.

The voltage ("L" level) of the node ND17 is applied to the input terminal of the inverter circuit INV1. The inverter circuit INV1 outputs a voltage at the "H" level to the node ND9. A voltage of the node ND9 becomes a voltage at the "H" level.

In the FF circuit FF2, the voltage ("H" level) of the node ND9 is applied to the terminal CLK, the voltage VREG is applied to the terminal D, and the voltage ("L" level) of the node ND11 is applied to the terminal R. Accordingly, a voltage at the "H" level is output from the terminal Q of the FF circuit FF2 to the node ND12. The voltage Vnd12 of the node ND12 becomes a voltage at the "H" level. Accordingly, the transistor N4 is turned on. A voltage of the node ND13 becomes a voltage at the "L" level (for example, the voltage GND). Accordingly, the transistor N5 is turned off. A voltage of the node ND14 becomes a voltage at the "H" level. Accordingly, the transistor N6 is turned on.

The timer circuit TMR outputs a voltage at the "L" level to the node ND10. A voltage of the node ND10 becomes a voltage at the "L" level.

As described above, the switching control circuit 30 electrically connects the ground voltage terminal P2 to the clamp circuit 10 when the voltage VIN makes a transition from the "H" level to the "L" level (when the transistor N1 makes a transition from the ON state to the OFF state).

The second control circuit CTL2 outputs a voltage at the "L" level based on the voltage VIN ("L" level) to the node ND6. The voltage Vnd6 of the node ND6 becomes a voltage at the "L" level. Accordingly, the transistor N2 is turned off. A voltage of the node ND7 becomes a voltage at the "H" level. Accordingly, the transistor N3 is turned on.

The driving circuit DRV outputs a voltage at the "L" level to the first output terminal P4 based on the voltage Vnd2 ("L" level) of the node ND2 and the voltage Vnd15 ("H" level) of the node ND15. The voltage VOUT1 of the first output terminal P4 becomes a voltage at the "L" level. The voltage VOUT1 ("L" level) is applied from the first output terminal P4 to the gate of the transistor N1. Accordingly, the transistor N1 is turned off. The voltage VDD is not supplied from the power supply voltage terminal P1 to the load LD. By this, the voltage Vnd1 of the node ND1 drops to a negative voltage by the inductor L1 releasing magnetic energy. As with the first embodiment, the voltage Vnd1 of the node ND1 drops to the clamp voltage VCL and then rises.

At the time T3, the voltage Vnd1 of the node ND1 becomes the voltage GND. The voltage VOUT2 of the second output terminal P5 becomes the voltage GND.

As described above, the clamp circuit 10 controls the voltage Vnd1 of the node ND1 based on a voltage of the ground voltage terminal P2. The operation from the time T2 to the time T3 corresponds to the first operation.

At the time T4, the timer circuit TMR outputs a voltage at the "H" level to the node ND10. A voltage of the node ND10 becomes a voltage at the "H" level. The time T4 is, for example, the time after a certain period of time has elapsed from the time T2, that is, the time after a certain period of time has elapsed from transition of the voltage Vnd12 of the node ND12 to the "H" level.

The first control circuit CTL1 outputs a voltage at the "L" level based on the voltage VIN ("L" level) to the node ND2. The voltage Vnd2 of the node ND2 becomes a voltage at the "L" level.

The protection circuit PRT outputs a voltage at the "H" level to the node ND15. The voltage Vnd15 of the node ND15 becomes a voltage at the "H" level.

In the NAND circuit NAND1, the voltage Vnd2 ("L" level) of the node ND2 is applied to one input terminal, and the voltage Vnd15 ("H" level) of the node ND15 is applied to the other input terminal. The NAND circuit NAND1 outputs a voltage at the "H" level to the node ND16. A voltage of the node ND16 becomes a voltage at the "H" level.

The voltage ("H" level) of the node ND16 is applied to the input terminal of the inverter circuit INV2. The inverter circuit INV2 outputs a voltage at the "L" level to the node ND17. A voltage of the node ND17 becomes a voltage at the "L" level.

In the FF circuit FF1, the voltage ("L" level) of the node ND17 is applied to the terminal CLK, the voltage VREG is applied to the terminal D, and a voltage at the "H" level is applied from the timer circuit TMR to the terminal R. Accordingly, values of the terminals Q and QN of the FF circuit FF1 are reset to the "L" level and the "H" level, respectively. The voltage at the "H" level is output from the terminal QN of the FF circuit FF1 to the node ND11. A voltage of the node ND11 becomes a voltage at the "H" level.

The voltage ("L" level) of the node ND17 is applied to the input terminal of the inverter circuit INV1. The inverter circuit INV1 outputs a voltage at the "H" level to the node ND9. A voltage of the node ND9 becomes a voltage at the "H" level.

In the FF circuit FF2, the voltage ("H" level) of the node ND9 is applied to the terminal CLK, the voltage VREG is applied to the terminal D, and the voltage ("H" level) of the node ND11 is applied to the terminal R. Accordingly, values of the terminals Q and QN of the FF circuit FF2 are reset to the "L" level and the "H" level, respectively. A voltage at the "L" level is output from the terminal Q of the FF circuit FF2 to the node ND12. The voltage Vnd12 of the node ND12 becomes a voltage at the "L" level. Accordingly, the transistor N4 is turned off. A voltage of the node ND13 becomes a voltage at the "H" level. Accordingly, the transistor N5 is turned on. A voltage of the node ND14 becomes a voltage at the "L" level. Accordingly, the transistor N6 is turned off.

The timer circuit TMR outputs a voltage at the "L" level to the node ND10. A voltage of the node ND10 becomes a voltage at the "L" level.

As described above, the switching control circuit 30 electrically connects the ground voltage terminal P2 to the clamp circuit 10, and upon elapse of a predetermined period of time, electrically disconnects the ground voltage terminal P2 from the clamp circuit 10.

The second control circuit CTL2 outputs a voltage at the "L" level based on the voltage VIN ("L" level) to the node ND6. The voltage Vnd6 of the node ND6 becomes a voltage at the "L" level. Accordingly, the transistor N2 is turned off. A voltage of the node ND7 becomes a voltage at the "H" level. Accordingly, the transistor N3 is turned on.

The driving circuit DRV outputs a voltage at the "L" level to the first output terminal P4 based on the voltage Vnd2 ("L" level) of the node ND2 and the voltage Vnd15 ("H" level) of the node ND15. The voltage VOUT1 of the first output terminal P4 becomes a voltage at the "L" level. The voltage VOUT1 ("L" level) is applied from the first output terminal P4 to the gate of the transistor N1. Accordingly, the transistor N1 is turned off. The voltage VDD is not supplied from the power supply voltage terminal P1 to the load LD. Accordingly, the voltage Vnd1 of the node ND1 becomes the voltage GND. The voltage VOUT2 of the second output terminal P5 becomes the voltage GND.

No current flows through the diodes D1 and ZD1 to ZD3.

As shown in FIG. 6, at the time T5, the timer circuit TMR outputs a voltage at the "L" level to the node ND10. A voltage of the node ND10 becomes a voltage at the "L" level.

The operation of the semiconductor device 1 from the time T5 to the time T6 is similar to that from the time T0 to the time T1.

At the time T6, the voltage VIN at the "H" level is supplied to the input terminal P3.

The operation of the semiconductor device 1 from the time T6 to the time T7 is similar to that from the time T1 to the time T2.

At the time T7, the protection circuit PRT detects an abnormality.

Upon detection of the abnormality, the protection circuit PRT outputs a voltage at the "L" level to the node ND15. The voltage Vnd15 of the node ND15 becomes a voltage at the "L" level (for example, the voltage GND). In the NAND circuit NAND1, the voltage Vnd2 ("H" level) of the node ND2 is applied to one input terminal, and the voltage Vnd15 ("L" level) of the node ND15 is applied to the other input terminal. The NAND circuit NAND1 outputs a voltage at the "H" level to the node ND16. A voltage of the node ND16 becomes a voltage at the "H" level.

The voltage ("H" level) of the node ND16 is applied to the input terminal of the inverter circuit INV2. The inverter circuit INV2 outputs a voltage at the "L" level to the node ND17. A voltage of the node ND17 becomes a voltage at the "L" level.

In the FF circuit FF1, the voltage ("L" level) of the node ND17 is applied to the terminal CLK, the voltage VREG is applied to the terminal D, and a voltage at the "L" level is applied from the timer circuit TMR to the terminal R. Accordingly, a voltage at the "L" level is output from the terminal QN of the FF circuit FF1 to the node ND11. A voltage of the node ND11 becomes a voltage at the "L" level.

The voltage ("L" level) of the node ND17 is applied to the input terminal of the inverter circuit INV1. The inverter circuit INV1 outputs a voltage at the "H" level to the node ND9. A voltage of the node ND9 becomes a voltage at the "H" level.

In the FF circuit FF2, the voltage ("H" level) of the node ND9 is applied to the terminal CLK, the voltage VREG is applied to the terminal D, and the voltage ("L" level) of the node ND11 is applied to the terminal R. Accordingly, a voltage at the "H" level is output from the terminal Q of the FF circuit FF2 to the node ND12. The voltage Vnd12 of the node ND12 becomes a voltage at the "H" level. Accordingly, the transistor N4 is turned on. A voltage of the node ND13 becomes a voltage at the "L" level (for example, the voltage GND). Accordingly, the transistor N5 is turned off. A voltage of the node ND14 becomes a voltage at the "H" level. Accordingly, the transistor N6 is turned on.

The timer circuit TMR outputs a voltage at the "L" level to the node ND10. A voltage of the node ND10 becomes a voltage at the "L" level.

As described above, when the protection circuit PRT detects an abnormality, the switching control circuit 30 electrically connects the ground voltage terminal P2 to the clamp circuit 10.

The second control circuit CTL2 outputs a voltage at the "L" level to the node ND6. The voltage Vnd6 of the node ND6 becomes a voltage at the "L" level. Accordingly, the transistor N2 is turned off. A voltage of the node ND7 becomes a voltage at the "H" level. Accordingly, the transistor N3 is turned on.

The driving circuit DRV outputs a voltage at the "L" level to the first output terminal P4 based on the voltage Vnd2 ("L" level) of the node ND2 and the voltage Vnd15 ("H" level) of the node ND15. The voltage VOUT1 of the first output terminal P4 becomes a voltage at the "L" level. The voltage VOUT1 ("L" level) is applied from the first output terminal P4 to the gate of the transistor N1. Accordingly, the transistor N1 is turned off. The voltage VDD is not supplied from the power supply voltage terminal P1 to the load LD. By this, the voltage Vnd1 of the node ND1 drops to a negative voltage by the inductor L1 releasing magnetic energy. As with the first operation, the voltage Vnd1 of the node ND1 drops to the clamp voltage VOL and then rises.

At the time T8, the voltage VIN at the "L" level is supplied to the input terminal P3. The voltage Vnd1 of the node ND1 becomes the voltage GND. The voltage VOUT2 of the second output terminal P5 becomes the voltage GND. Accordingly, the protection circuit PRT no longer detects an abnormality.

After stopping detection of an abnormality, the protection circuit PRT outputs a voltage at the "H" level to the node ND15. The voltage Vnd15 of the node ND15 becomes a voltage at the "H" level.

As described above, the clamp circuit 10 controls the voltage Vnd1 of the node ND1 based on a voltage of the ground voltage terminal P2. The operation from the time T7 to the time T8 corresponds to the third operation.

The operation of the semiconductor device 1 from the time T8 to the time T10 is similar to that from the time T3 to the time T5.

As shown in FIG. 7, at the time T10, the timer circuit TMR outputs a voltage at the "L" level to the node ND10. A voltage of the node ND10 becomes a voltage at the "L" level.

The operation of the semiconductor device 1 from the time T10 to the time T11 is similar to that from the time T0 to the time T1.

At the time T11, the voltage VIN at the "H" level is supplied to the input terminal P3.

The operation of the semiconductor device 1 from the time T11 to the time T12 is similar to that from the time T1 to the time T2.

At the time T12, the ground voltage terminal P2 enters the GND disconnection state. At this time, the transistor N6 is turned off. That is, the switching control circuit 30 electrically disconnects the ground voltage terminal P2 from the clamp circuit 10.

When the ground voltage terminal P2 enters the GND disconnection state, a voltage of the ground voltage terminal P2 becomes unstable. Because of the transistor N6 being in the OFF state, a voltage of the ground voltage terminal P2 rises up to the voltage VDD.

At the time T13, the voltage difference between the power supply voltage terminal P1 and the ground voltage terminal P2 becomes smaller than a voltage value that enables the second control circuit CTL2 to be driven. Accordingly, the second control circuit CTL2 outputs a voltage at the "L" level to the node ND6. The voltage Vnd6 of the node ND6 becomes a voltage at the "L" level. Accordingly, the transistor N2 is turned off.

At the time T14, a voltage of the node ND7 becomes a voltage at the "H" level. Accordingly, the transistor N3 is turned on. A charge is rapidly extracted from the gate of the transistor N1 to the second output terminal P5. Accordingly, a voltage of the gate of the transistor N1 drops quickly.

At the time T15, a voltage of the gate of the transistor N1 becomes the voltage GND. Accordingly, the transistor N1 is turned off. In other words, the voltage VOUT1 of the first output terminal P4 becomes a voltage for turning off the transistor N1. The voltage VDD is not supplied from the power supply voltage terminal P1 to the load LD. Accordingly, the voltage Vnd1 of the node ND1 becomes the voltage GND. The voltage VOUT2 of the second output terminal P5 becomes the voltage GND.

The rest of the operation of the semiconductor device 1 from the time T12 to the time T15 is similar to that from the time T1 to the time T2.

As described above, the disconnection protection circuit 20 controls a voltage of the first output terminal P4 based on a voltage of the ground voltage terminal P2 and a voltage of the input terminal P3. The operation from the time T12 to the time T15 corresponds to the second operation.

2.4 Advantageous Effects

The present embodiment produces advantageous effects similar to those of the first embodiment.

Furthermore, in the present embodiment, when the protection circuit PRT detects an abnormality, the transistor N6 is turned on. That is, the ground voltage terminal P2 and the clamp circuit 10 are electrically connected to each other. In other words, the ground voltage terminal P2 and the node ND1 are electrically connected to each other with the diodes D1, ZD1, ZD2, and ZD3, and the second output terminal P5 intervening therebetween. Therefore, as with the first operation, the voltage Vnd1 of the node ND1 is clamped to the clamp voltage VCL. When the protection circuit PRT detects an abnormality, this can also prevent the voltage Vnd1 of the node ND1 from dropping beyond the breakdown voltage between the drain and the source of the transistor N1 and prevent the transistor N1 breaking down.

3. Modifications, Etc.

As described above, a semiconductor device (1) according to an embodiment includes a first transistor (N1), a first circuit (10), a second circuit (20), and a third circuit (30). One end of the first transistor (N1) is connected to a power supply voltage terminal (P1), the other end of the first transistor (N1) is connected to a first node (ND1), and a gate of the first transistor (N1) is connected to a first output terminal (P4). The first circuit (10) is configured to control a voltage (Vnd1) of the first node (ND1) based on a voltage of a ground voltage terminal (P2). The second circuit (20) is configured to control a voltage (VOUT1) of the first output terminal (P4) based on the voltage of the ground voltage terminal (P2) and a voltage (VIN) of an input terminal (P3). The third circuit (30) is configured to control switching between connection and disconnection between the ground voltage terminal (P2) and the first circuit (10).

The embodiments are not limited to the above-described aspects, but can be modified in various ways.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
a first transistor, one end of the first transistor being connected to a power supply voltage terminal, the other end of the first transistor being connected to a first node, a gate of the first transistor being connected to a first output terminal;
a first circuit configured to control a voltage of the first node based on a voltage of a ground voltage terminal;
a second circuit configured to control a voltage of the first output terminal based on the voltage of the ground voltage terminal and a voltage of an input terminal; and
a third circuit configured to control switching between connection and disconnection between the ground voltage terminal and the first circuit, wherein
the third circuit includes a fourth circuit configured to measure a period of time and output a voltage,
when the ground voltage terminal is in a non-disconnection state with an outside and the first transistor makes a transition from an ON state to an OFF state, the third circuit electrically connects the ground voltage terminal to the first circuit,
the third circuit electrically connects the ground voltage terminal to the first circuit, and upon elapse of a predetermined period of time, electrically disconnects the ground voltage terminal from the first circuit,
the third circuit electrically disconnects the ground voltage terminal from the first circuit based on a first voltage output from the fourth circuit, and
the first voltage indicates that the predetermined period of time has elapsed.

2. The device according to claim 1, wherein
when the third circuit electrically connects the ground voltage terminal to the first circuit, the voltage of the first node does not drop beyond a breakdown voltage transistor from a power supply voltage.

3. The device according to claim 1, wherein
when the ground voltage terminal is in a disconnection state with the outside, the third circuit electrically disconnects the ground voltage terminal from the first circuit.

4. The device according to claim 3, wherein
when the third circuit electrically disconnects the ground voltage terminal from the first circuit, the voltage of the first output terminal becomes a voltage for turning off the first transistor.

5. The device according to claim 1, further comprising a fifth circuit configured to detect an abnormality when the ground voltage terminal is in a non-disconnection state with the outside and the fifth circuit detects the abnormality, the third circuit electrically connects the ground voltage terminal to the first circuit.

6. The device according to claim 5, wherein
when the third circuit electrically connects the ground voltage terminal to the first circuit, the voltage of the first node does not drop beyond a breakdown voltage between the one end and the other end of the first transistor from a power supply voltage.

7. The device according to claim 5, further comprising:
a sixth circuit configured to output a second voltage based on a power supply voltage and the voltage of the input terminal; and
a seventh circuit configured to drive the first transistor based on the second voltage,
wherein the third circuit includes a second transistor configured to control switching between connection and disconnection between the ground voltage terminal and the first circuit based on the second voltage.

8. The device according to claim 1, further comprising a first resistance element, one end of the first resistance element being connected to the first output terminal, the other end of the first resistance element being connected to the first node, a first zener diode, a second zener diode, and a third zener diode,
an anode of the diode is connectable to the ground voltage terminal, and a cathode of the diode is connected to a cathode of the first zener diode,
an anode of the first zener diode is connected to the first output terminal and a cathode of the second zener diode,
an anode of the second zener diode is connected to a cathode of the third zener diode, and
an anode of the third zener diode is connected to the first node.

9. The device according to claim 7, wherein the second circuit includes:
an eighth circuit configured to output a third voltage based on a power supply voltage, the voltage of the ground voltage terminal, and the voltage of the input terminal;
a second resistance element, one end of the second resistance element being connected to the first output terminal; and
a third transistor, one end of the third transistor being connected to the other end of the second resistance element, the other end of the third transistor being connected to the first node, the third transistor being configured to control switching between connection and disconnection between the second resistance element and the first node based on the third voltage.

* * * * *